United States Patent [19]

Kattner et al.

[11] 4,065,717
[45] Dec. 27, 1977

[54] MULTI-POINT MICROPROBE FOR TESTING INTEGRATED CIRCUITS

[75] Inventors: Lionel E. Kattner, Saratoga; Albert P. Youmans, Cupertino; Patrick J. Shasby, San Jose, all of Calif.

[73] Assignee: Signetics Corporation, Synnyvale, Calif.

[21] Appl. No.: 380,859

[22] Filed: July 19, 1973

Related U.S. Application Data

[60] Continuation of Ser. No. 72,521, Sept. 15, 1970, which is a continuation of Ser. No. 733,718, May 31, 1968, abandoned, which is a division of Ser. No. 336,489, Jan. 8, 1964, Pat. No. 3,405,361.

[51] Int. Cl.² .................... G01R 1/06; G01R 31/26

[52] U.S. Cl. .............. 324/158 P; 324/72.5; 357/70

[58] Field of Search ............. 324/158 F, 158 P, 72.5; 357/7 D

[56] References Cited

U.S. PATENT DOCUMENTS

| 3,317,287 | 5/1967 | Caracciolo | 317/234 N |
| 3,440,027 | 4/1969 | Hugle | 317/234 N |

Primary Examiner—William D. Larkins
Attorney, Agent, or Firm—Flehr, Hohbach, Test, Albritton & Herbert

[57] ABSTRACT

A multi-point probe for contacting closely spaced pads of a semiconductor device, having a flexible sheet-like member which carries the probes that make contact with the semiconductor device.

14 Claims, 8 Drawing Figures

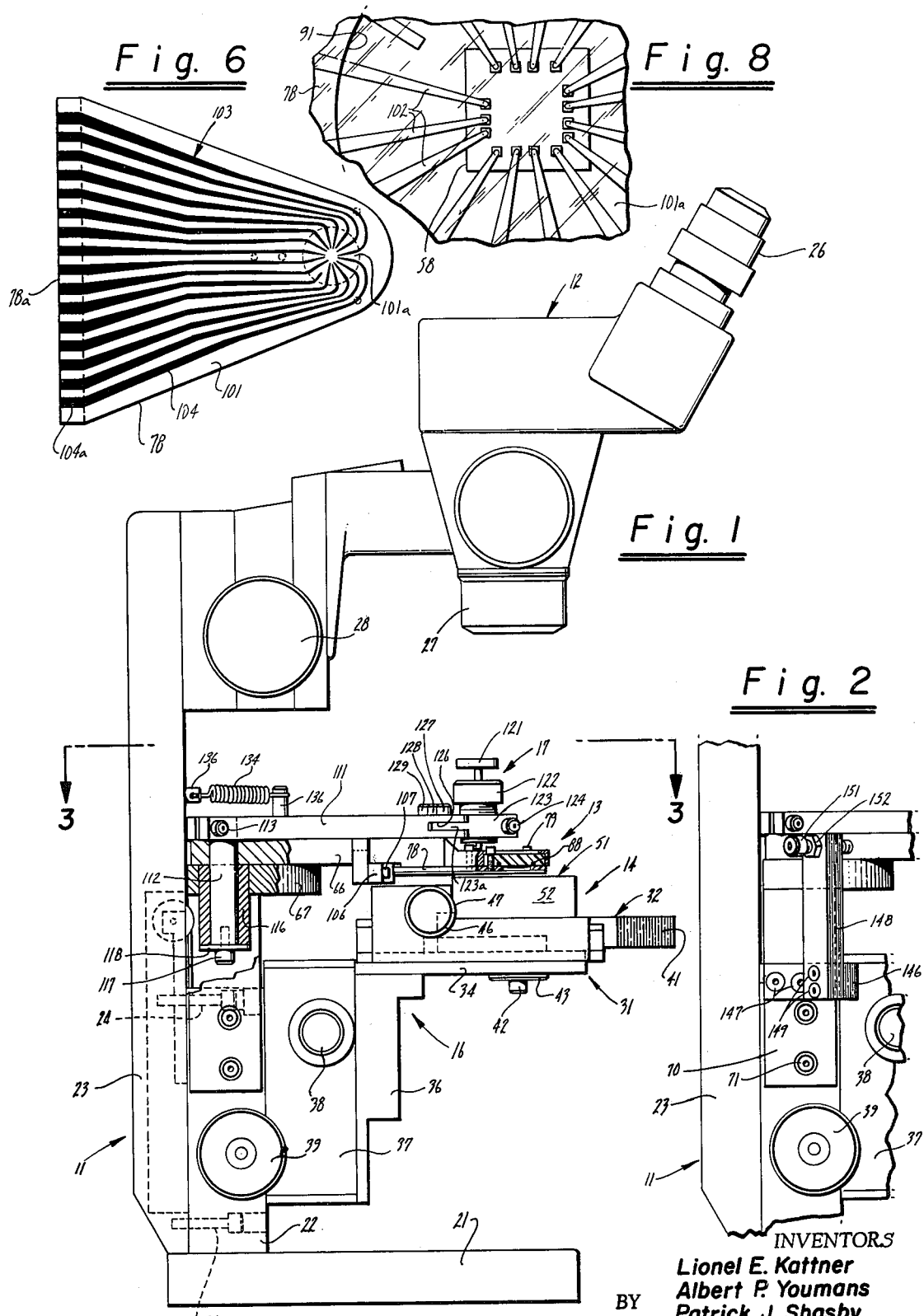

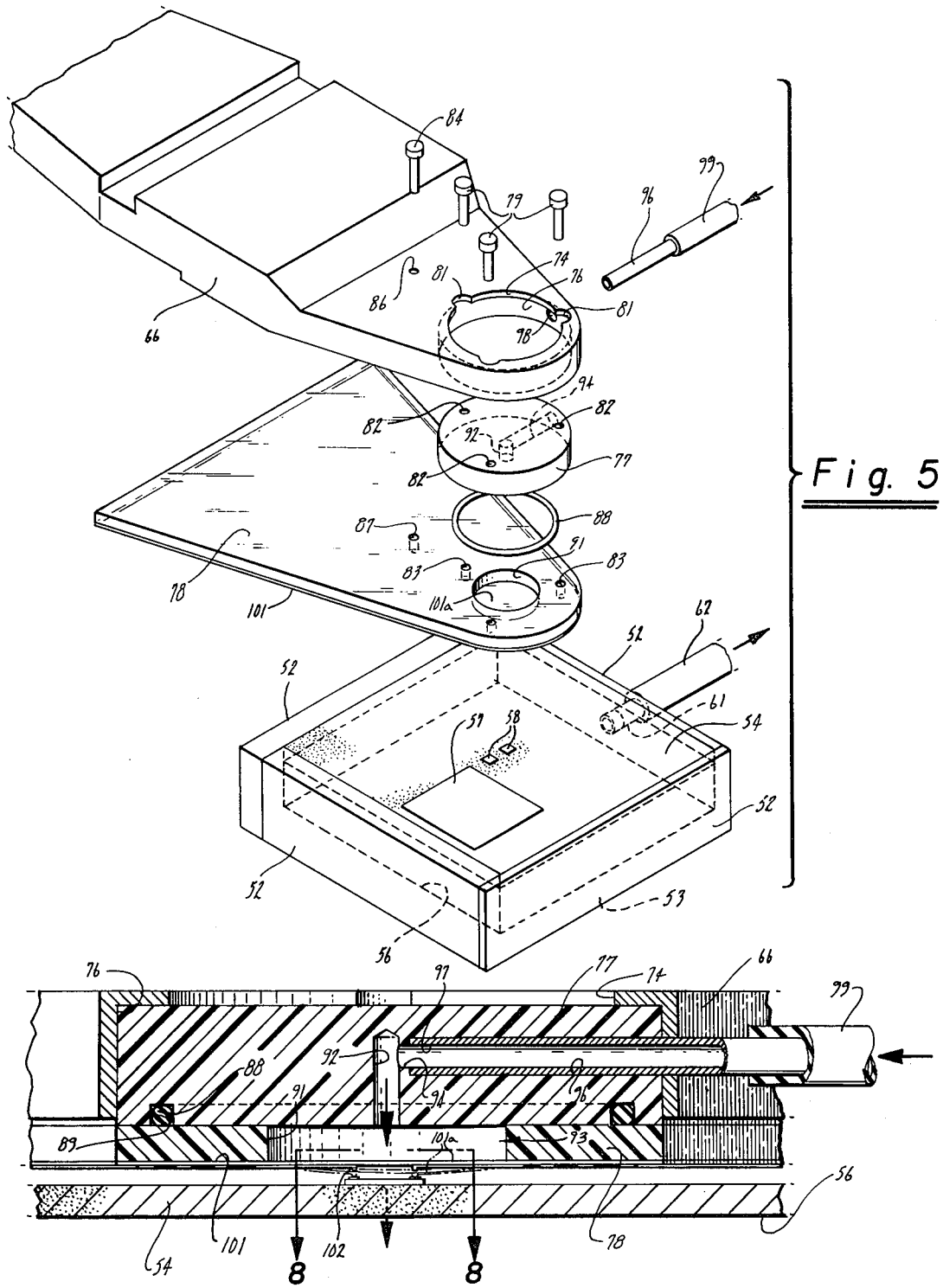

MULTI-POINT MICROPROBE FOR TESTING INTEGRATED CIRCUITS

CROSS-REFERENCES TO RELATED APPLICATIONS

This application is a continuation of Ser. No. 72,521, filed Sept. 15, 1970, now abandoned, which was a continuation of Ser. No. 733,718, filed May 31, 1968, now abandoned, which was a division of Ser. No. 336,489, filed Jan. 8, 1964, now U.S. Pat. No. 3,405,361.

BACKGROUND OF THE INVENTION

This invention relates to a multi-point microprobe, and more particularly to a multi-point microprobe for making multiple electrical contacts with many closely spaced regions on a device as, for example, an integrated circuit or a thin film circuit.

In the development and manufacture of devices utilizing integrated circuits or thin film circuits, it has been necessary to make contact with closely spaced regions of the circuits to check the circuits. Heretofore, it has been the practice to use fine wire probes that are positioned in an appropriate array and spring-loaded in some manner to provide a pressure connection when brought into contact with the device. The use of such means has been found to have several disadvantages: The leads are flexible and can be bent out of alignment with their contact areas. It is extremely difficult to construct an array of wires when the array has a minute geometry due to the difficulty involved in machining a suitable assembly for supporting the wires. It is difficult to maintain a uniform spring-loading on all of the leads for the same reasons. Also, it is difficult to align such an array over the areas it is desired to contact because vision is obstructed by the wires themselves. It, therefore, can be seen that there is a need for a new and improved apparatus for overcoming these difficulties.

In general, it is an object of the present invention to provide a multi-point microprobe which overcomes the above named disadvantages.

Another object of the invention is to provide a microprobe of the above character in which it is possible to precisely position the microprobe and to readily view the areas being contacted by the microprobe.

Another object of the invention is to provide a microprobe of the above character in which the probes can be readily moved into engagement with the areas to be contacted.

Another object of the invention is to provide a microprobe of the above character in which the probes are accessible so that electrical contact can be readily made with the probes.

Another object of the invention is to provide a microprobe of the above character which can be readily aligned with the device to which contact is to be made.

Another object of the invention is to provide a microprobe of the above character which can be operated by relatively unskilled personnel.

Another object of the invention is to provide a microprobe of the above character which can be simply and easily constructed.

Additional features and objects of the invention will appear from the following description in which the preferred embodiment is set forth in detail in conjunction with the following drawings.

Referring to the drawings:

FIG. 1 is a side elevational view, partly in cross-section, of a multi-point microprobe incorporating our invention.

FIG. 2 is a partial side elevational view of the microprobe shown in FIG. 1.

FIG. 5 is an exploded isometric view of a portion of the microprobe.

FIG. 6 is a plan view of one of the elements showing the thin film circuitry utilized.

FIG. 7 is an enlarged cross-sectional view of a portion of the multi-point microprobe.

FIG. 8 is a cross-sectional view looking along the line 8—8 of FIG. 7.

Figure 3:
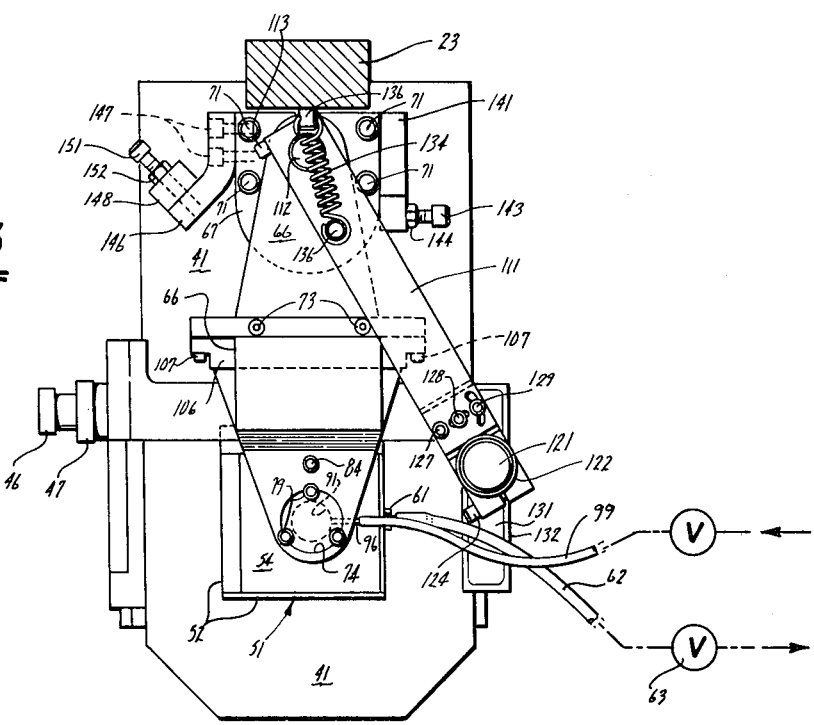
FIG. 3 is a cross-sectional view taken along the line 3—3 of FIG. 1.

In general, our microprobe which is utilized for making contact with closely spaced areas on a device consists of a backing plate. A deformable member which has a relatively flat exposed surface is mounted on the backing plate. At least one probe is mounted on one portion of the deformable member and circuitry is connected to the probe. Means is provided for mounting the backing plate and the device to permit relative movement between the same so that the probe or probes carried by the deformable member are in relatively close proximity to the device. Means is also provided for causing the portion of said deformable member carrying the probe to be deformed from its normal condition to move the probe or probes into contact with said device.

More particularly as shown in the drawings, our multi-point microprobe consists of a stand 11. A microscope 12 is mounted on the stand. The microprobe also consists of a probe assembly 13 and a device holder or worktable 14. Means 16 is provided on the stand for causing relative movement between the probe assembly and the device holder. A marking device 17 is mounted on the stand for marking defective devices.

The stand 11 consists of a base 21. A support block 22 is mounted on the base. A vertically extending support column 23 is secured to the block by suitable means such as cap screws 24. The microscope 12 is mounted upon the upper end of the vertical support column 23 and is of a conventional type. It includes eyepieces 26, a lens system 27 of a fixed magnification and a knob 28 for adjusting the focus of the microscope.

The means 16 for causing relative movement between the probe assembly and the device holder consists of a vertically movable stage 31 and a horizontally movable stage 32 which is mounted on the vertically movable stage 31. The vertically movable stage 31 consists of a horizontal plate 34 which is affixed to the upper end of a block 36. The block 36 is slidably mounted for vertical movement on a block 37 which carries means (not shown) controlled by vernier knobs 38 for causing relatively fine adjustable movement of the block 36 relative to the block 37. The block 37 is mounted for vertical sliding movement with respect to the block 22 and means (not shown) controlled by knobs 39 is provided for a coarse and relatively rapid vertical adjustment of the plate 34.

Figure 4:
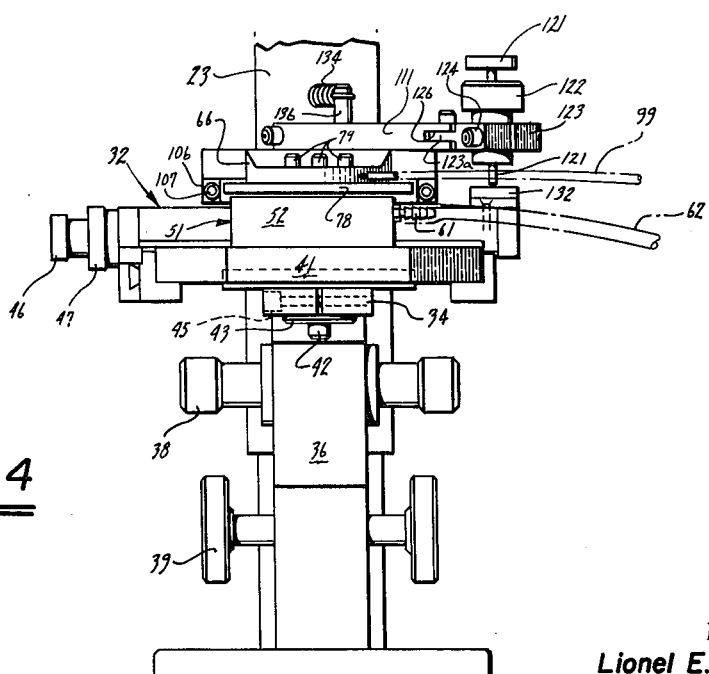
FIG. 4 is a partial front elevational view of the microprobe as shown in FIG. 1.

The horizontally movable state 32 consists of a mounting plate 41 which is mounted for pivotal or rotational movement on the plate 34 by suitable means. As shown, such means can include a cap screw 42 and a washer 43, and cap screws 45 (FIG. 4) which engage a portion (not shown) of the plate 41 and serve to frictionally retain the plate 42 in the desired position relative to the plate 34 after it has been shifted. Means (not shown) is provided which includes two knobs 46 and 47 for adjusting the plate 41 in a horizontal direction, namely, in a lateral direction and in a back and forth direction. For example, the knob 46 can be utilized for moving the plate 41 in a sideways or lateral direction and the knob 47 can be utilized for moving the plate 41 in a back and forth direction while at the same time rotating it about the vertical axis formed by the screw 42.

It should be pointed out that the stages 31 and 32 are of a conventional construction with the exception of the rotational movement provided, and are often used in conjunction with microscopes.

The device holder or device worktable 14 is mounted upon the plate 41 of the horizontally movable stage 32 and consists of a rectangular box 51 which is provided with four side walls 52 and a bottom wall 53. A relatively rigid and porous member 54 formed of a suitable material such as sintered bronze is mounted upon the box and serves to form the top side of the box so that an enclosed chamber 56 is formed within the box.

Devices such as semiconductor devices 57 and 58 shown in the drawing are adapted to be positioned upon the box 51. Suitable means is provided for retaining the devices 57 and 58 in a fixed position on the box 51 and, as shown in the drawing, consists of a connector 61 which is mounted on one side wall 52 of the box and opens into the chamber 54. A hose 62 has one end connected to the connector 61 and haas its other end connected through a control valve 63 to a suitable source of vacuum (not shown) so that the chamber 56 may be placed under a continuous vacuum. When the chamber is under vacuum or below atmospheric pressure, air is being drawn continuously through the member 54 of sintered material to thereby suck the devices 57 and 58 into substantial frictional engagement with the member 54 to thereby prevent movement of the same relative to the box 51. It is readily apparent that merely by varying the vacuum in the chamber 56, the force applied to the devices 57 and 58 to hold them in place on the box 51 can be varied.

The probe assembly 13 consists of a mounting plate 66 which is secured to a mounting block 67. The mounting block 67 is secured to the block 22 by suitable means such as two side plates 70 and cap screws 71, as shown in FIG. 2.

The mounting plate 66 is provided with a rounded outer end which is provided with a circular opening 74. The front mounting plate is also provided with a circular recess 76 which is of a slightly larger diameter than the opening 74 and which is in alignment with the opening 74 but opening from the bottom side of the mounting plate 66. A disc 77 of a suitable transparent material such as plastic is mounted in the recess 76. A backing plate 78 having the same general shape as the front end of mounting plate 66 is formed of a suitable material such as transparent plastic is positioned below the front mounting plate. The disc 77 is secured to the backing plate 78 by cap screws 79 positioned in notches 81 provided in the mounting plate and extending through holes 82 in the disc 77 and threaded into holes 83 provided in the backing plate 78. An additional cap screw 84 extends through a hole 86 in the mounting plate 66 and is threaded into a hole 87 in the backing plate 78 to secure the plate 66 to the plate 78.

Suitable sealing means is provided between the backing plate 78 and the disc 77 and consists of an O-ring 88 which is disposed in an annular recess 89 formed in the lower surface of the disc 77.

The backing plate 78 is formed with a circular hole 91 which is in general axial alignment with the disc 77. A vertical passage 92 is provided in the disc 77 and opens into a chamber 93 formed by the hole 91. The passageway 92 is connected to a horizontally extending passageway 94. A tube 96 is mounted in the disc 77 and has its bore 97 opening into the passageway 94. The tube 96 extends through a hole 98 provided in the mounting plate 66 and is connected to a hose 99 which is connected to a suitable source of fluid under pressure as, for example, the exhaust side of a vacuum pump which is utilized for supplying the vacuum to the hose or tube 62.

A deformable member 101 is mounted upon the lower surface of the backing plate 78. The deformable member 101 can be formed of any suitable material such as a thin transparent plastic film which is bonded to the backing plate 78 in a suitable manner such as by heat. This deformable member 101 extends across the hole 91 so that the portion 101a of the deformable member extending across the chamber 93 can be deformed as hereinafter described.

A plurality of probes 102 are mounted on a portion 101a of the deformable member 101 in a desired geometrical configuration. Circuitry 103 is provided on the deformable member 101 and is connected to the probes 102. The probes 102 and the circuitry 103 can be formed in any suitable manner. For example, as shown in the drawings, the circuitry and probes 103 and 102 can be formed by thin film techniques. As is well known to those skilled in the art, the geometry of the metallic film can be confined to desired areas by conventional masking and etching techniques to provide any desired pattern. Thus, as shown particularly in FIG. 6, the circuitry 103 consists of a plurality of relatively narrow leads 104 which are formed as a thin film on the deformable member 101 and which extend from a rear edge 78a of the backing plate 78 where they form large, very accessible contact areas or terminal portions 104a. As hereinafter explained, the terminal portions 104a of the leads adjacent the edges 78a serve as connecting terminals which are removably positioned in a connector block 106 secured to the mounting plate 66 by suitable means such as cap screws 107.

The leads 104 extend forward and are gradually tapered as shown and terminate in the portion 101a of the deformable member 101. The ends of the leads are provided with raised portions which form the probes 102 as shown particularly in FIG. 7. These raised portions can also be formed by conventional thin film or plating techniques. It is readily apparent that the positioning of the probes on the porton 101a can portion in any desired pattern as, for example, the substantially circular pattern shown in FIG. 6.

With the construction hereinbefore described, it can be seen that the backing plate 78 which carries the thin film circuitry and probes 102 can be readily removed from the connector 106 merely by removing the screws 79 and 84 that a replacement backing plate can be readily inserted.

The marking device 17 consists of an arm 111 which is secured to a vertical shaft 112 by suitable means such as a cap screw 113 which is threaded into the arm 111 and causes the arm to frictionally engage the shaft 112. The shaft 112 is rotatably mounted in a bearing 116 which is mounted in the mounting block 67. A cap screw 117 and a washer 118 are provided for retaining the shaft 112 in the bearing 116.

A spring-loaded plunger 121 is mounted on the outer end of the arm 111. The spring-loaded plunger is mounted in a cylindrical member 122 which is carried by a mounting member 123. The cylindrical member 122 is clamped into the mounting member 123 by a cap screw 124. Means is provided fo mounting the member 123 on the outer end of the arm 111 to permit adjustment of the same. This means consists of a recess 126 which is provided on the outer end of the arm 111 and which is adapted to receive an extension 123a provided on the support member 123. Screws 127, 128 and 129 are mounted on the outer end of the arm 111 and extend into the portion 123a of the support member 123. The screw 128 is provided with an eccentric (not shown) so that the position of the plunger 121 relative to the arm 11 can be shifted in directions longitudinally and laterally of the arm 111 merely by loosening of the screws 128 and turning of the screw 127.

The plunger 121 is adapted to engage an ink pad 131 carried by an ink pad holder 132 mounted on the stage 32.

Means is provided for yieldably urging the arm 111 to an out-of-the-way position and consists of a spring 134 which has one end secured to a pin 136 provided on the vertical support column 23 and which has the other end secured to a pin 136 provided on the arm 111.

Means is provided for limiting the travel of the arm 111 between a position overlying the ink pad 131 on one side of the mounting plate 66 and a position overlying the device. This means consists of a bracket 141 which is secured to the side plates 70 by suitable means such as cap screws 142. A cap screw 143 is threaded into the outer end of the bracket 142 and is adapted to be engaged by the arm 111 to limit the travel of the arm under the urging of the spring 134. A lock nut 144 is provided to retain the cap screw 143 in the desired position. The other stop means consists of a bracket 146 which is secured to the support block 22 by suitable means such as cap screws 147. An upright member 148 is secured to the bracket 146 by suitable means such as screws 149. A cap screw 151 is threaded into the upper end of the member 148 and is retained in a predetermined position by a lock nut 152.

Operation and use of out multi-point microprobe may now be briefly described as follows. Let is be assumed that it is desired to check a device which is commonly known as an integrated circuit or microcircuitry such as the devices 57 and 58 shown in FIG. 5 of the drawings. Also, let is be assumed that a vacuum is applied to the hose 62 so that air is continuously drawn through the member 54 of sintered material so that the devices 57 and 58 are held down relatively tightly on the member 54. After this has been accomplished, the knob 39 is adjusted to bring the device into relatively close proximity to the probes 102. Thereafter, with the use of the microscope 12, the device is precisely positioned so that the areas of the device to be contacted by the probes immediately underlie the probes. This is accomplished by adjusting the vernier knob 38 for vertical movement and for adjusting the knob 46 for lateral movement and the knob 47 for back and forth movement. This can be readily accomplished because the device to be tested can be seen through the microscope through the opening 74 in the front mounting plate 72, the transparent disc 77 and through the transparent deformable member 101. Very accurate alignment can be obtained because the probes 102 which are the extremities of the leads 104 can be exactly aligned with the areas it is desired to contact on the device 57, as can be seen from FIG. 8. Thereafter, as soon as the proper alignment has been made, a control valve 100 can be operated so that a fluid under pressure is applied to the chamber 93 through the bore 97, the passages 94 and 92. As pressure is applied, the relatively thin diaphragm formed by the deformable member 101 will be deformed or bowed outwardly so that the probes 102 are urged into a firm contact with the closely spaced areas of the semiconductor device to be tested or checked.

It is readily apparent that by varying the fluid under pressure which is applied to the chamber 93, the contact pressure which the probes 102 make with the device can be varied. Because the probes 102 are raised above the surface of the leads 104, the leads 104 will not come in contact with the semiconductor device and, therefore, there is no possibility of shorting out areas of the semiconductor device. If desired to provide additional insurance, an insulating film in the form of a thin coating of varnish, plastic or other insulating material can be placed on the leads 104 to prevent any possibility of shorting out any portion of the semiconductor device when the probes 102 are moved into contact with the semiconductor device.

After the semiconductor device has been checked and found to be satisfactory, the air pressure on the tube 99 can be removed. Thereafter, the vacuum can be removed on the chamber 56. The stages 31 and 32 can then be lowered and the device which has been tested can be removed. Additional devices can then be placed on the stage and checked in the same manner.

In the event a device is found to be unsatisfactory, the marking devices 17 can be utilized to mark the semiconductor device as being defective. This can be accomplished by first pressing the plunger 121 until it engages the ink pad and thereafter swinging the arm to the left until it engages the cap screw 151. Thereafter, the plunger 121 is depressed so that it strikes the semiconductor device to mark it with ink to indicate that it is defective.

Although we have shown an ink marking device for indicating defective devices, it is readily apparent that other types of marking devices can be provided. For example, a small motor driven burnishing wheel or the like can be provided on the arm 111 for destroying or scribing certain of the elements of the semiconductor device to indicate that it is defective.

From the foregoing, it can be seen that I have provided a new and improved multi-point microprobe which is particularly adapted for use with semiconductor and similar devices which utilize microcircuitry. With the arrangement disclosed, it is possible to precisely position the multi-point probe so that very closely spaced areas of a semiconductor device can be contacted. In addition, by utilization of the deformable member, it is possible to ensure that the probes will make good contact with these areas of the semiconductor device.

We claim:

1. In an assembly, a semiconductor device having a substantially planar surface area, a plurality of relatively closely spaced contact pads provided on said surface area and forming a pattern of contact pads exclusively adjacent the outer perimeter of the device, a flexible sheet-like member of an insulating material having one portion thereof forming a substantially planar surface and a plurality of spaced leads of thin metallic film adherent to and being supported by said surface of said sheet-like member with said leads being insulated from each other and having inner and outer extremities, the inner extremities of the leads being substantially narrower than the outer extremities, the inner extremities of the leads forming a pattern of contact areas which conform to the pattern of the contact pads, said semiconductor device and said flexible sheet-like member being positioned adjacent each other and with the contact areas and the contact pads in electrical contact with each other.

2. An assembly as in claim 1 wherein said flexible sheet-like member is substantially transparent to permit viewing of the inner extremities of the leads and the pads of the semiconductor device through the sheet-like member.

3. An assembly as in claim 1 wherein the inner extremities of the leads have raised portions.

4. A combination as in claim 2 wherein said flexible sheet-like member is substantially transparent to permit viewing of the inner extremities of the leads and the pads of the semiconductor device through the sheet-like member.

5. In a multiple contact lead structure for use with a semiconductor device having a substantially planar surface with a plurality of closely spaced contact pads on said surface forming a pattern adjacent the outer perimeter of the same, the multiple contact lead structure comprising a flexible sheet-like member of insulating material having one portion thereof forming a substantially planar surface and a plurality of spaced leads of thin metallic film adjacent to said surface of said sheet-like member so that they are insulated from each other and having inner and outer extremities with the inner extremities being generally tapered and substantially narrower than the outer extremities, the inner extremities forming a pattern of contact areas lying generally in a single plane which conform to the pattern of the contact pads and are adapted to make contact therewith.

6. A structure as in claim 5 wherein said sheet-like member is substantially transparent to permit viewing of the leads through the sheet-like member.

7. In combination, a semiconductor device having a substantially planar surface area, a plurality of relatively closely spaced contact pads provided on said surface area and forming a pattern of contact pads exclusively adjacent the outer perimeter of the device, a flexible sheet-like connector member of an insulating material having one portion thereof forming a substantially planar surface and a plurality of spaced leads of thin metallic film adherent to and being supported by said surface of said sheet-like member with said leads being insulated from each other and having inner and outer extremities, the inner extremities of the leads being substantially narrower than the outer extremities, the inner extremities of the leads forming a pattern of contact areas which conform to the pattern of the contact pads, said semiconductor device and said flexible sheet-like member being positioned adjacent each other and with the contact areas and the contact pads in electrical contact with each other.

8. A combination as in claim 7 wherein said flexible sheet-like member is substantially transparent to permit viewing of the inner extremities of the leads and the pads of the semiconductor device through the sheet-like member.

9. In an assembly, a semiconductor device having a substantially planar surface area, a plurality of relatively closely spaced contact pads provided on said surface area and forming a pattern of contact pads exclusively adjacent the outer perimeter of the device, a flexible sheet-like member of an insulating material having one portion thereof forming a substantially planar surface and a plurality of spaced leads of thin metallic film adherent to and being supported by said surface of said sheet-like member with said leads being insulated from each other and having inner and outer extremities, the inner extremities of the leads being substantially narrower than the outer extremities, the inner extremities of the leads forming a pattern of contact areas which conform to the pattern of the contact pads, said semiconductor device and said flexible sheet-like member being positioned adjacent each other and with the contact areas and the contact pads in at least temporary electrical contact with each other.

10. An assembly as in claim 9 wherein said flexible sheet-like member is substantially transparent to permit viewing of the inner extremities of the leads and the pads of the semiconductor device through the sheet-like member.

11. An assembly as in claim 9 wherein the inner extremities of the leads having raised portions.

12. In a multiple contact lead structure for use with a semiconductor device having a substantially planar surface with a plurality of closely spaced contact pads on said surface forming a pattern adjacent the outer perimeter of the same, a flexible sheet-like member of insulating material having one portion thereof forming a substantially planar surface and a plurality of spaced leads of thin metallic film adjacent to said surface of said sheet-like member so that they are insulated from each other and having inner and outer extremities with the inner extremities being generally tapered and substantially narrower than the outer extremities, the inner extremities forming a pattern of contact areas lying generally in a single plane which conform to the pattern of the contact pads and are adapted to at least make temporary contact therewith.

13. A structure as in claim 12 wherein said sheet-like member is substantially transparent to permit viewing of the leads through the sheet-like member.

14. In combination, a semiconductor device having a substantially planar surface area, a pluraity of relatively closely spaced contact pads provided on said surface area and forming a pattern of contact pads exclusively adjacent the outer perimeter of the device, a flexible sheet-like connector member of an insulating material having one portion thereof forming a substantially planar surface and a plurality of spaced leads of thin metallic film adherent to and being supported by said surface of said sheet-like member with said leads being insulated from each other and having inner and outer extremities, the inner extremities of the leads being substantially narrower than the outer extremities, the inner extremities of the leads forming a pattern of contact areas which conform to the pattern of the contact pads, the semiconductor device and said flexible sheet-like member being positioned adjacent each other and with the contact areas and the contact pads in at least temporary electrical contact with each other.

* * * * *